(12) United States Patent
Yu et al.

(10) Patent No.: US 11,810,777 B2
(45) Date of Patent: Nov. 7, 2023

(54) COMPOSITE ENCAPSULATING MATERIAL AND PHOTOVOLTAIC MODULE INCLUDING THE SAME

(71) Applicants: Jinko Green Energy (Shanghai) Management Co., LTD., Shanghai (CN); ZHEJIANG JINKO SOLAR CO., LTD., Zhejiang (CN)

(72) Inventors: Kun Yu, Shanghai (CN); Changming Liu, Shanghai (CN); Xinyu Zhang, Shanghai (CN); Beibei Gao, Shanghai (CN); Zengzhi Ma, Shanghai (CN)

(73) Assignees: Jinko Green Energy (Shanghai) Management Co., LTD., Shanghai (CN); ZHEJIANG JINKO SOLAR CO., LTD., Haining (CN)

( * ) Notice: Subject to any disclaimer, the term of this patent is extended or adjusted under 35 U.S.C. 154(b) by 187 days.

(21) Appl. No.: 16/999,899

(22) Filed: Aug. 21, 2020

(65) Prior Publication Data
US 2021/0408309 A1 Dec. 30, 2021

(30) Foreign Application Priority Data
Jun. 30, 2020 (CN) .......................... 202010617148.5

(51) Int. Cl.
*H01L 31/048* (2014.01)
*C09J 7/24* (2018.01)
(Continued)

(52) U.S. Cl.
CPC ........ *H01L 31/0481* (2013.01); *C08K 5/5419* (2013.01); *C09J 7/245* (2018.01);
(Continued)

(58) Field of Classification Search
CPC ...... C09J 2479/08; C09J 7/245; C09J 179/08; C09J 11/08; C09J 2301/408;
(Continued)

(56) References Cited

U.S. PATENT DOCUMENTS

| 2003/0091842 A1* | 5/2003 | Murakami | ............. H05K 3/281 |
| | | | 428/473.5 |
| 2005/0096429 A1* | 5/2005 | Lee | ........................ B32B 27/281 |
| | | | 525/178 |

(Continued)

FOREIGN PATENT DOCUMENTS

| CN | 201478334 U | 5/2010 |
| CN | 102668108 A | 9/2012 |

(Continued)

OTHER PUBLICATIONS

European Search Report for EP 20191947.9 dated Jan. 20, 2021.
First Office Action of Chinese Application No. 2020106171485, dated Dec. 24, 2021, in 17 pages.

*Primary Examiner* — Uyen M Tran
(74) *Attorney, Agent, or Firm* — Knobbe Martens Olson & Bear LLP (57) ABSTRACT

Provided is a composite encapsulating material and a photovoltaic module encapsulated with the composite encapsulating material, which relate to the technical field of photovoltaic modules. At least a partial area of the composite encapsulating material includes a high insulation material, and the high insulation material includes polyimide, modifier and modified polyimide. The above technical solution can improve an insulation performance of the encapsulating material, reduce a blank area of an edge of the module, reduce a weight of the photovoltaic module, and further reduce comprehensive cost of the photovoltaic module.

20 Claims, 2 Drawing Sheets

(51) Int. Cl.
*C09J 7/38* (2018.01)
*C08K 5/5419* (2006.01)
*C09J 11/08* (2006.01)
*C09J 179/08* (2006.01)
*C09J 11/06* (2006.01)

(52) U.S. Cl.
CPC ............... *C09J 7/38* (2018.01); *C09J 11/08* (2013.01); *C09J 179/08* (2013.01); *C09J 11/06* (2013.01); *C09J 2203/322* (2013.01); *C09J 2301/408* (2020.08); *C09J 2301/414* (2020.08); *C09J 2423/046* (2013.01); *C09J 2479/08* (2013.01)

(58) Field of Classification Search
CPC ..... C09J 2301/414; C09J 11/06; C09K 7/245; C08K 5/5419; H01L 31/0481
See application file for complete search history.

(56) References Cited

U.S. PATENT DOCUMENTS

| | | | |
|---|---|---|---|
| 2006/0234038 A1* | 10/2006 | Kernander | B32B 27/20 |
| | | | 428/522 |
| 2009/0139564 A1 | 6/2009 | Miyaji et al. | |
| 2009/0165290 A1* | 7/2009 | Yu | H01M 50/121 |
| | | | 29/623.2 |
| 2011/0057351 A1 | 3/2011 | Miyaji et al. | |
| 2011/0213075 A1* | 9/2011 | Goshima | C08G 73/1042 |
| | | | 524/588 |
| 2012/0107615 A1 | 5/2012 | Hetzler et al. | |
| 2013/0288120 A1* | 10/2013 | Iida | H01L 31/0481 |
| | | | 524/592 |
| 2015/0270426 A1 | 9/2015 | Funo et al. | |
| 2018/0282577 A1* | 10/2018 | Cheng | C08G 73/14 |

FOREIGN PATENT DOCUMENTS

| | | | | |
|---|---|---|---|---|
| CN | 102668124 A | 9/2012 | | |
| CN | 103250259 A | 8/2013 | | |
| CN | 103666244 A | 3/2014 | | |
| CN | 107699127 A | 2/2018 | | |
| CN | 109337108 A | 2/2019 | | |
| CN | 110240803 A | 9/2019 | | |
| EP | 1930953 A1 | 6/2008 | | |
| EP | 2612879 A1 | 7/2013 | | |
| EP | 2930756 A1 | 10/2015 | | |
| JP | 2006169352 A | 6/2006 | | |
| WO | WO 2012/040591 A2 | 9/2011 | | |
| WO | WO 2012/114918 A1 | 8/2012 | | |
| WO | WO-2012114918 A1 * | 8/2012 | ....... | B32B 17/10018 |
| WO | WO 2012/161405 A1 | 11/2012 | | |
| WO | 2017159538 A1 | 9/2017 | | |

* cited by examiner

COMPOSITE ENCAPSULATING MATERIAL AND PHOTOVOLTAIC MODULE INCLUDING THE SAME

CROSS-REFERENCE TO RELATED APPLICATIONS

The present application claims priority to Chinese Patent Application No. 202010617148.5, filed on Jun. 30, 2020, the content of which is incorporated herein by reference in its entirety.

TECHNICAL FIELD

The present disclosure relates to the technical field of photovoltaic modules and, in particular, to a composite encapsulating material and a photovoltaic module encapsulated with the composite encapsulating material.

BACKGROUND

Solar energy is a kind of clean energy, and a working principle of photovoltaic modules is to convert solar energy into electrical energy based on a photovoltaic effect. Existing crystalline silicon photovoltaic modules are generally manufactured by successively stacking of front tempered glass, a front adhesive film layer or a front encapsulating adhesive film layer, a solar cell layer, a rear adhesive film layer or a rear encapsulating adhesive film layer, and a back plate or rear tempered glass, and then laminated and encapsulated. The encapsulating adhesive film layer generally uses polyolefin elastomer (POE) material or ethylene-vinyl acetate copolymer (EVA) material.

However, the existing encapsulating material POE has problems such as long curing time, long lamination cycle, and low capacity utilization, which increase encapsulating cost. In addition, due to the limitations of relatively low bulk resistivity and poor insulation performance of conventional encapsulating materials such as EVA, a certain width needs to be maintained between a charged body inside the module and a fixing frame (metal frame), thereby increasing material consumption and weight of the photovoltaic module.

Therefore, it is necessary to research and develop encapsulating materials having high insulation performance, which can reduce an electrical safety distance through improving the insulation performance of the materials, such that a utilization rate of materials such as glass can be improved, and the weight of the module can be further reduced.

SUMMARY

An object of the present disclosure is to provide a composite encapsulating material and a photovoltaic module encapsulated by the composite encapsulating material, which can improve the insulation performance of the encapsulating material, reduce blank area at the edge of the module, reduce the weight of the photovoltaic module, and can overcome the above problems or at least partially solve the above technical problems.

In order to achieve the above object, the technical solutions adopted in the present disclosure are as follows.

According to an aspect of the present disclosure, the present disclosure provides a composite encapsulating material, including a high insulation material in at least a partial area of the composite encapsulating material, wherein the high insulation material includes polyimide, modifier and modified polyimide.

In an embodiment, the high insulation performance material includes improved polyimide, and the improved polyimide includes polyimide, modifier and modified polyimide.

In an embodiment, the high insulation material further includes an auxiliary agent, and the auxiliary agent at least includes an anti-aging agent.

In an embodiment, the anti-aging agent includes polybutylene terephthalate.

In an embodiment, modifier includes one or more of polyperfluoroethylene propylene, polypropylene, tetramethyldisiloxane, polyurethane, or sorbitol; and/or the modified polyimide includes fluorine-containing linear polyimide.

In an embodiment, the modifier at least includes transparency modifier, and the transparency modifier includes, but is not limited to, one or more of polyperfluoroethylene propylene, polypropylene, tetramethyldisiloxane, polyurethanes, or sorbitol.

In an embodiment, the high insulation material includes: 70-95 parts of polyimide, 1-10 parts of polyperfluoroethylene propylene, 2-10 parts of fluorine-containing linear polyimide, and 2-10 parts of tetramethyldisiloxane.

In an embodiment, the high insulation material includes: 70-80 parts of polyimide, 2-5 parts of polyperfluoroethylene propylene, 2-6 parts of fluorine-containing linear polyimide, and 2-5 parts of tetramethyldisiloxane.

In an embodiment, the composite encapsulating material further includes a polymer material, and the polymer material includes one or more of polyolefin, ethylene-vinyl acetate copolymer, or modified ethylene-vinyl acetate copolymer.

In an embodiment, the composite encapsulating material is a composite encapsulating adhesive film, and the composite encapsulating adhesive film is a co-extruded film of the high insulation material and the polymer material.

In an embodiment, the composite encapsulating material is a composite encapsulating adhesive film formed by bonding the high insulation material and the polymer material.

In an embodiment, the at least partial area includes an edge area of the composite encapsulating material.

According to another aspect of the present disclosure, the present disclosure provides a photovoltaic module, including the composite encapsulating material described above, and at least one group of solar cell strings encapsulated by the composite encapsulating material.

Compared with the related art, the technical solution according to the present disclosure can achieve following beneficial effects:

At least the partial area of the composite encapsulating material includes the high insulation material. The high insulation material may include improved polyimide. The improved polyimide includes polyimide, modifier and modified polyimide, and the polyimide has relatively high volume-resistivity (bulk resistivity) and excellent insulation performance. The modifier may include transparency modifier, and addition of modifier can realize transparent modification of polyimide and improve the transparency of polyimide, while addition of modified polyimide helps to increase the degree of crosslinking, so that the crosslinking speed is fast, and formability or processability is good. Therefore, through the functional coordination, support and coordination of respective raw materials of the polyimide, modifier and modified polyimide, the high insulation material has excellent insulation performance, high transparency, excellent processability, and good formability, and thus the composite encapsulating material containing the high insulation material is very suitable for use as the encapsulating material for the photovoltaic modules. The composite encapsulating material can achieve a bulk resistivity of $1 \times 10^{17}$ Ω·cm and above and a breakdown voltage strength of 80 KV/mm and above, so it is possible to reduce the distance between the charged body inside the photovoltaic module and the fixing frame, that is, to reduce the blank area at the edge of the module, improve the utilization rate of the material, reduce the material consumption and weight of the photovoltaic module, and thus help to reduce the cost.

The photovoltaic module of the present disclosure includes the composite encapsulating material and has all the features and advantages of the composite encapsulating material described above, which will not be repeated here.

It should be understood that the above general description and the following detailed description are only exemplary and shall not be understood as providing any limitation to the present disclosure.

BRIEF DESCRIPTION OF DRAWINGS

In order to more clearly illustrate the embodiments of the present disclosure or the technical solutions in the related art, the accompany drawings used in the description of the embodiments or the related art will be briefly introduced below. It is appreciated that, the accompany drawings in the following description are only embodiments of the present disclosure, and other drawings can be obtained by those of ordinary skill in the art from the provided drawings without creative work.

REFERENCE SIGNS

100—composite encapsulating material;
101—high insulation material;
102—polymer material;
200—glass;
300—solar cell string;
400—back plate.

DESCRIPTION OF EMBODIMENTS

In order to make the purpose, technical solutions, and advantages of the present disclosure clearer, the present disclosure will be further described below in detail with reference to the drawings and embodiments. It should be understood that the specific embodiments described here are only used to explain the present disclosure, but not to limit the present disclosure.

In the description of the present disclosure, unless particularly specified or defined otherwise, the term "plurality" refers to two or more; the singular form "a", "an" "said" and "the" used in the embodiments and appended claims of the present disclosure are also intended to represent a plural form thereof, unless the context clearly indicates other meanings. It should be understood that the term "and/or" used is merely an association relationship describing associated objects. It means that there can be three kinds of relationships, for example, A and/or B can represent: A alone exists, A and B exist at the same time, and B exists alone.

It should be understood that the terminology such as "above", "below", "inside", and "outside" described in the embodiments of the present disclosure are described from the perspective of the accompanying drawings and should not be understood as a limitation to the embodiments of the present disclosure. In addition, it should also be understood that when it is mentioned that an element is connected "above" or "below" another element, it can be directly connected "above" and "below" another element, or can be indirectly connected "above" and "below" another element through an intermediate element.

If there is no specified illustration, all technical features mentioned herein can be combined with each other to form a new technical solution. Unless otherwise defined or illustrated, professional and scientific terms used herein have the same meaning as those familiar to those skilled in the art.

In the present disclosure, unless otherwise specified, a numerical range "a-b" represents an abbreviated representation of any combination of real numbers between a and b, and both a and b are real numbers. For example, a numerical range "1-10" means that all real numbers between "1-10" have been listed herein, and "1-10" is only an abbreviated representation of these numerical combinations.

The "range" disclosed in the present disclosure is in a form of lower and upper limits, which can be one or more lower limits and one or more upper limits, respectively.

According to relevant standards, the safety performance of photovoltaic modules should meet safety standards for creepage distance (electrical clearance distance and distance through insulation) in the IEC61730-1 standard. Requirements of 1000V and 1500V systems for thicknesses of module materials are 0.15 mm and 0.30 mm, respectively, and the minimum distance between a charged body and a frame metal is 15.0 mm. Through adjustment and design of the encapsulating material, it is helpful to reduce the creepage distance.

Those skilled in the art understand that, as stated in the background portion, the current encapsulating materials still have certain defects more or less. The performance of EVA or modified EVA is better than other materials, such as transparent silicone, polyurethane, acrylate, polyvinyl butyral (PVB), ionic polymer, etc., but its bulk resistivity is generally $1 \times 10^{14}$ Ω·cm-$1 \times 10^{15}$ Ω·cm, the bulk resistivity is relatively low, the insulation performance is poor, and a certain width distance needs to be maintained between the charged body inside the module and a fixing frame (the metal frame), which will lead to an increase in the material consumption and weight of the photovoltaic module. In addition, currently, POE (polyolefin material) is mostly used as the encapsulating material for bifacial modules, and its bulk resistivity is close to $1 \times 10^{16}$ Ω·cm, so if POE is used to replace EVA, although the bulk resistivity can be increased to a certain extent, existing POE materials have problems such as long curing time, long lamination cycle, and low capacity utilization.

Therefore, in order to overcome imperfections of the existing technology and further meet the current market demands, the embodiments of the present disclosure provide a composite encapsulating material and a photovoltaic module encapsulated with the composite encapsulating material, so as to improve the insulation performance of the encapsulating material of the photovoltaic module through high-performance composite insulation material, and reduce the creepage distance between the solar cell and the metal frame of the module under the premise of satisfying insulation safety, thereby achieving the object of reducing the material consumption of the module.

In some embodiments, the present disclosure provides a composite encapsulating material, and at least a partial area of the composite encapsulating material includes a high insulation material. In some embodiments, the high insulation material may include improved polyimide, and the improved polyimide includes polyimide, modifier, and modified polyimide. In some embodiments, the modifier may include a transparency modifier.

The composite encapsulating material is a high-performance composite encapsulating adhesive film, the composite encapsulating material can achieve a bulk resistivity greater than or equal to (not lower than) $1 \times 10^{17}$ Ω·cm, and breakdown voltage strength is greater than or equal to (not lower than) 80 KV/mm. The composite encapsulating material is very suitable for being used as an encapsulating material for the photovoltaic modules. Adopting this composite encapsulating material can reduce the electrical safety distance, improve the utilization rate of materials such as glass in photovoltaic modules, and alleviate the problems of long curing time, long lamination cycle, and low capacity utilization of existing high-resistance POE materials, or the problem of the poor insulation performance of the existing EVA materials. In addition, the composite encapsulating material has better performance than the POE materials, and can reduce a blank area at an edge of the module while meeting the safe creepage distance.

Specifically, at least a partial area of the composite encapsulating material includes a high insulation material, and the high insulation material includes polyimide (PI), modifier and modified polyimide. The polyimide has good heat resistance, has outstanding mechanical properties including mechanical strength, abrasion resistance, dimensional stability and chemical resistance, and has excellent electrical properties including insulation performances. The bulk resistivity of the polyimide can reach an order of $1 \times 10^{16}$ Ω·cm to $1 \times 10^{17}$ Ω·cm and above, and it has excellent insulation performance. However, the existing common polyimide has a relatively low visible light transmittance (usually around 80%), and if the existing PI materials are directly used as encapsulating materials, there may be a problem of relatively low light transmittance. The existing polyimide is not suitable for directly making encapsulating materials, it needs to be further improved so that it has excellent insulation performances, as well as excellent optical transmittance, better breakdown voltage strength or mechanical performances, etc., which can meet demands on the encapsulating materials for the photovoltaic modules. Therefore, the present disclosure improves the polyimide, addition of modifier can realize transparent modification of polyimide and improve the transparency of polyimide, so that the composite encapsulating material has excellent optical transmittance. Moreover, the addition of modified polyimide helps to increase a degree of crosslinking, so that a crosslinking speed is fast, and formability or processability is good. Therefore, through the functional coordination, support and matching of respective raw materials of the polyimide, modifier and modified polyimide, the high insulation material has excellent insulation performance, high transparency, excellent processability, good formability, and high breakdown voltage strength, and thus the composite encapsulating material containing the high insulation material is very suitable for use as the encapsulating material for the photovoltaic modules. Furthermore, the composite encapsulating material can reduce the distance between the charged body inside the photovoltaic module and the fixing frame, that is, to reduce the blank area at the edge of the module, improve the utilization rate of the material, reduce the material consumption and weight of the photovoltaic module, and thus help to reduce the cost.

It should be noted that, among the components included in the above high insulation materials, the present disclosure does not impose strict restrictions on performance parameters of the involved polyimide such as source, specific type or specific molecular weight, and common polyimides known in the art may be selected; for example, commercially available products thereof may be used, or they may be prepared by using preparation methods well known to those skilled in the art.

Any known polyimide can be included in the improved polyimide composition of the present disclosure.

In order to further improve the performance of the high insulation material, the high insulation material may also include other ingredients to improve the performance desired or required for any particular application. For illustration, in some embodiments, the high insulation material further includes an auxiliary agent, and the auxiliary agent at least includes an anti-aging agent. That is, the high insulation material may include polyimide, transparency modifier, modified polyimide and optional auxiliary agents, and the auxiliary agent can be added or not added according to actual application occasions or actual needs.

Further, the auxiliary agent may include, but not limited to, an anti-aging agent. For example, in other implementations, the auxiliary agent may also include antioxidants, light stabilizers, heat stabilizers, fillers, reinforcing agents, or other types of various auxiliary agents. The present disclosure does not impose special restrictions on the specific type or the number of the auxiliary agent added, and it may be adjusted by those skilled in the art according to actual situations, for example, desired or required performance auxiliary agents may be added according to actual application scenarios or product requirements.

It can be understood that the high insulation material mainly includes polyimide, transparency modifier and modified polyimide, and other acceptable auxiliary agents, auxiliary materials, etc. can be optionally added, and there are no special restrictions on these auxiliary agents, auxiliary materials, etc., as long as it does not limit the object of the present disclosure and does not affect functioning of the high insulation material.

In order to better cooperate with other components in the high insulation material and better achieve aging resistance or weather resistance, in some embodiments, the anti-aging agent includes, but is not limited to, one or more of polybutylene terephthalate (PBT), polyethylene terephthalate (PET), or acrylonitrile-butadiene styrene copolymer (ABS) or a mixture of any of them in any ratio. For example, the anti-aging agent can be PBT, or PET, or ABS, or a mixture of PBT and PET, and or a mixture of PET and ABS. It should be noted that when the anti-aging agent includes a mixture formed by arbitrarily mixing PBT, PET and ABS, the various components can be mixed uniformly in any ratio, and the embodiments of the present disclosure do not impose special restrictions on the specific ratio or content, which can be adjusted by those skilled in the art according to actual conditions. In addition, the specific type of the anti-aging agent can be, but not limited to, the above types. For example, in other embodiments, the anti-aging agent can also be anti-aging materials such as rubber materials, carbon nanotubes, polyurethane, and the present disclosure does not limit the specific type and source of the anti-aging agent.

The addition of suitable auxiliary agents such as anti-aging agents can facilitate to further improve the weather resistance, heat resistance or aging resistance of the encapsulating material, so that the encapsulating material can be better used in photovoltaic modules.

Among the components included in the above improved polyimide, the present disclosure does not strictly limit the transparency modifier and modified polyimide involved. However, in order to achieve a better coordination/synergistic effect between the respective components, the present disclosure makes following limitations on the transparency modifier and modified polyimide:

In some exemplary embodiments, the transparency modifier includes, but is not limited to, one or more of polyperfluoroethylene propylene (FEP), polypropylene (PP), tetramethyldisiloxane (HMM), polyurethane, sorbitol or a mixture of any of them in any ratio. Specifically, the transparency modifier can be FEP, or PP, or HMM, or polyurethane, or sorbitol, or a mixture of FEP and HMM, or a mixture of FE, PP and HMM, or a mixture of FE, HMM and polyurethane, and so on. In addition, the specific types of the transparency modifier can be, but not limited to, the above types. For example, in other embodiments, the transparency modifier may also include transparency modifier materials such as inorganic transparency modifiers.

As an example, the transparency modifier includes polyperfluoroethylene propylene and tetramethyldisiloxane. That is, in a certain embodiment, the improved polyimide includes polyimide, polyperfluoroethylene propylene, tetramethyldisiloxane, and modified polyimide.

The above polyperfluoroethylene propylene has properties such as good electrical insulation properties, heat resistance or high temperature resistance, chemical resistance, wear resistance, and has good processing properties. In addition, the breakdown voltage strength of polyperfluoroethylene propylene can reach at least 160 KV/mm, and the polyperfluoroethylene propylene has a relatively wide range of sources and relatively low cost, making it suitable for transparent modification or antireflection of polyimide. Similarly, the above tetramethyldisiloxane has properties such as good electrical insulation properties, heat resistance, chemical stability, and has good processing properties, making it suitable for transparent modification or antireflection of polyimide. In addition, polyperfluoroethylene propylene and tetramethyldisiloxane have good compatibility with polyimide, and dispersibility is good. The antireflection by adding polyperfluoroethylene propylene and tetramethyldisiloxane is simple in process, has significant effect, and can effectively improve the transparency of polyimide.

In some exemplary embodiments, the modified polyimide includes but is not limited to fluorine-containing linear polyimide. The modified polyimide may be a fluorine-containing polyimide, and further may be a fluorine-containing linear polyimide. The fluorine-containing linear polyimide has a short carbon chain, which helps to increase the degree of crosslinking, such that the crosslinking speed is fast, the formability or processability is good, making it easier to process the material. In addition, the fluorine-containing linear polyimide can improve the weather resistance of ordinary polyimides. In addition, a specific type of the modified polyimide may be the above-mentioned fluorine-containing linear polyimide, but it is not limited thereto. For example, in other embodiments, the modified polyimide may also include other modified polyimide materials having similar structures or properties such as the fluorine-containing linear polyimide.

In some exemplary embodiments, the improved polyimide includes polyimide, polyperfluoroethylene propylene, tetramethyldisiloxane, and fluorine-containing linear polyimide.

Further, in some embodiments, the improved polyimide includes following mass parts of raw materials, that is, the improved polyimide is mainly prepared from following mass parts of raw materials:

70-95 parts of polyimide, 1-10 parts of polyperfluoroethylene propylene, 2-10 parts of fluorine-containing linear polyimide, and 2-10 parts of tetramethyldisiloxane.

It should be noted that in the present disclosure, unless otherwise stated, the percentages, ratios, or parts and the like involved are based on mass. The percentage (including mass percentage) in the present disclosure is based on the total mass of the composition. "Mass parts" refers to a basic measurement unit of the mass ratio relationship of multiple components, and one part can represent any unit mass. For example, 1 part can represent 1 g, can represent 2.68 g, and can also represent 5 g, and so on.

In the above-mentioned improved polyimide, the mass parts of the polyimide is 70-95 parts, typical but non-limiting, for example, it can be 70 parts, 72 parts, 74 parts, 75 parts, 78 parts, 80 parts, 82 parts, 84 parts, 85 parts, 88 parts, 90 parts, 92 parts, 94 parts, 95 parts, and any value in a range formed by any two of these point values. The mass parts of the polyperfluoroethylene propylene is 1-10 parts, typical but non-limiting, for example, it may be 1 part, 2 parts, 3 parts, 4 parts, 5 parts, 6 parts, 7 parts, 8 parts, 9 parts, 10 parts, and any value in a range formed by any two of these point values. The mass parts of the fluorine linear polyimide is 2-10 parts, typical but non-limiting, for example, it can be 2 parts, 3 parts, 4 parts, 5 parts, 6 parts, 7 parts, 8 parts, 9 parts, 10 parts, and any value in a range formed by any two of these point values. The mass parts of the tetramethyldisiloxane are 2-10 parts, typical but non-limiting, for example, it can be 2 parts, 3 parts, 4 parts, 5 parts, 6 parts, 7 parts, 8 parts, 9 parts, 10 parts, and any value in a range formed by any two of these point values.

The improved polyimide is mainly prepared by suitable and appropriate amounts of polyimide, polyperfluoroethylene propylene, fluorine-containing linear polyimide and tetramethyldisiloxane, and through the functionally mutual coordination and support of the respective raw materials above, as well as mutual restriction and matching among the ratios, the improved polyimide has high appearance transparency, excellent insulation performance, excellent mechanical performance, excellent processing fluidity, and good formability. The present disclosure utilizes the characteristics of the improved polyimide and uses it as the encapsulating material for the photovoltaic modules, which can meet the requirements such as light transmittance, insulation performance and related mechanical performance, and allow the composite encapsulating material to achieve a bulk resistivity of not lower than $1 \times 10^{17}$ Ω·cm and a breakdown voltage strength of not lower than 80 KV/mm.

Further, in some embodiments, the improved polyimide includes following mass parts of raw materials: 70-80 parts of polyimide, 2-10 parts of polyperfluoroethylene propylene, 2-10 parts of fluorine-containing linear polyimide and 2-10 parts of tetramethyldisiloxane.

Further, in some embodiments, the improved polyimide includes following mass parts of raw materials: 70-80 parts of polyimide, 2-5 parts of polyperfluoroethylene propylene, 2-6 parts of fluorine-containing linear polyimide and 2-5 parts of tetramethyldisiloxane.

By rationally adjusting and optimizing a dosage of each component in the improved polyimide, the synergistic cooperation between the respective components can be fully utilized, to further improve the performances of the material such as the processing performance, permeability, insulation performance or mechanical performance, improve the quality of the product and further reduce the weight of the module.

In order to enable the improved polyimide to be better used in the encapsulating material of the photovoltaic modules, or to further improve the application performance of the encapsulating material, the improved polyimide can be combined with existing polymer materials such as existing POE, EVA and other materials, to prepare the composite encapsulating material. Specifically, in some embodiments, the composite encapsulating material further includes a polymer material, that is, the composite encapsulating material may include improved polyimide materials and polymer materials. Preparing the composite encapsulating material by combining the high insulation material of the improved polyimide with the existing polymer material can improve the insulation performance of the encapsulating material, reduce the distance between the solar cell and the frame, to achieve the object of reducing the weight of the module.

Further, the polymer material includes, but is not limited to, one or more of the polyolefins such as polyolefin elastomer material POE, ethylene-vinyl acetate copolymer (EVA) or modified ethylene-vinyl acetate copolymer or a mixture of any of them in any ratio. It can be understood that the polymer material can be an existing polymer material applied to the encapsulating material of the photovoltaic modules, and it can be POE, or EVA, or modified EVA, but it is not limited thereto, and it may also be other existing encapsulating material that can be applied to the photovoltaic modules, which are not particularly limited in the present disclosure.

Through using the improved polyimide of the high-insulation material to composite with the existing POE or EVA to form a composite encapsulating material, a crosslink ability of the material can reach at least 88%, the light transmittance can reach at least 92%, and the bulk resistivity is not lower than $1\times10^{17}$ Ω·cm, and the breakdown voltage strength is not lower than 80 KV/mm.

In some embodiments, a thickness of the modified polyimide material can be 10-300 μm, and further be 20-250 μm, and further be 30-200 μm, typical but non-limiting, it can be 10 μm, 20 μm, 25 μm, 30 μm, 40 μm, 50 μm, 60 μm, 80 μm, 100 μm, 120 μm, 150 μm, 180 μm, 200 μm, 250 μm, 300 μm and any value in a range formed by any two of these point values. Within this range, it is helpful to reduce the cost on the basis of ensuring the application performance of the material, that is, on the basis of ensuring the application performance such as light transmission and insulation performance; if the thickness is too small, it will be difficult to achieve in the process, and if the thickness is too large, the application performance will not increase significantly and the cost will increase.

The above composite encapsulating materials are high insulation composite encapsulating materials, which can be used for the encapsulating of the photovoltaic modules. In practical applications, the composite encapsulating material with different structures and shapes can be prepared according to the specific application scenarios of the composite encapsulating material or according to the structural characteristics of the photovoltaic modules. Specifically, in some embodiments, the at least partial area includes an edge area of the composite encapsulating material. That is, the composite encapsulating material can be composed of only the improved polyimide, or can also be composed of improved polyimide and existing polymer materials such as POE and EVA. When the composite encapsulating material is composed of improved polyimide and existing polymer materials such as POE and EVA, the edge area of the composite encapsulating material can be set as the improved polyimide material, or the edge area of the composite encapsulating material can be set as a hybrid material of improved polyimide material and existing polymer materials such as POE and EVA. That is, the edge area of the composite encapsulating material needs to include at least the improved polyimide. In this way, a geometric size of the glass in the module can be reduced, and materials such as adhesives and back plates can be saved, thereby improving the material utilization rate of the module, reducing the weight of the module, and achieving the object of reducing the comprehensive cost of the module.

Figure 1:
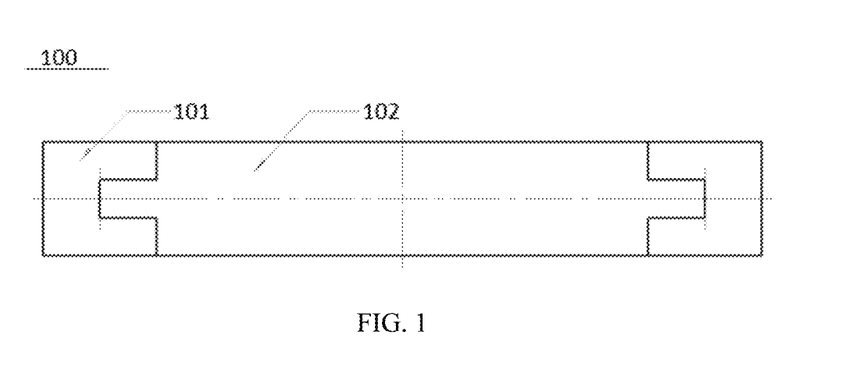
FIG. 1 is a schematic diagram of an exemplary composite encapsulating material according to an embodiment of the present disclosure.

The specific structure of the above composite encapsulating material can be of various types. Optionally, in some embodiments, as shown in FIG. 1, a composite encapsulating material 100 includes a high insulation material 101 and a polymer material 102, and the high insulation material 101 may be located in an edge area of the composite encapsulating material 100. In the composite encapsulating material 100, the high insulation material 101 may be arranged outside at least two ends of the polymer material 102. Optionally, the high insulation material 101 includes the above-mentioned improved polyimide.

Figure 2:
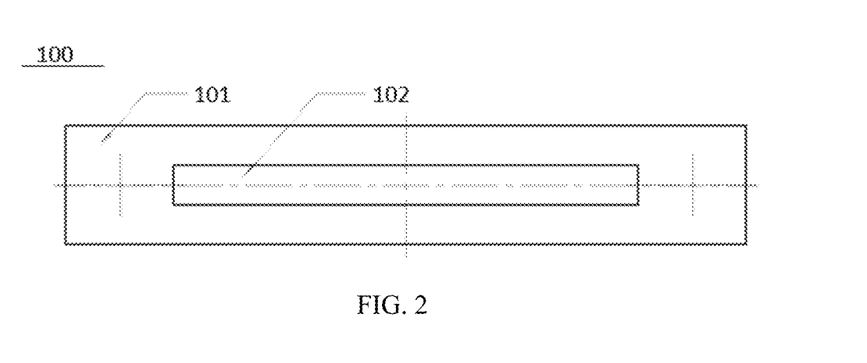
FIG. 2 is a schematic diagram of another exemplary composite encapsulating material according to an embodiment of the present disclosure.

Optionally, in other embodiments, as shown in FIG. 2, the composite encapsulating material 100 includes a high insulation material 101 and a polymer material 102, and the high insulation material 101 may be located in an edge area of the composite encapsulating material 100. For example, the improved polyimide is arranged in the edge area of the composite encapsulating material 100. In the composite encapsulating material 100, the improved polyimide may be arranged at the periphery of the polymer material 102.

Figure 3:
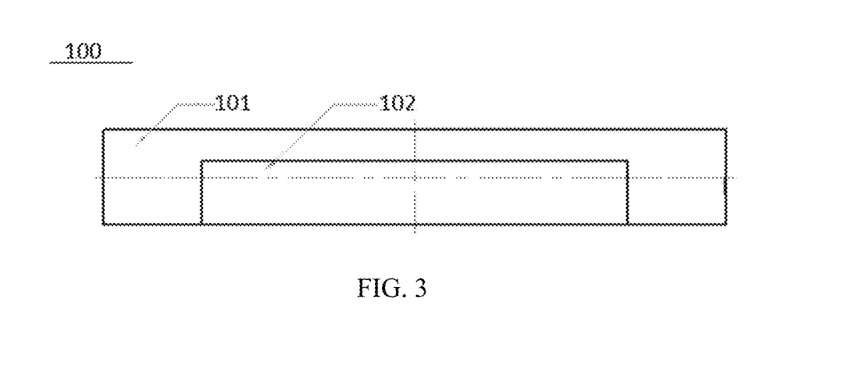
FIG. 3 is a schematic diagram of another exemplary composite encapsulating material according to an embodiment of the present disclosure.

Optionally, in other embodiments, as shown in FIG. 3, the composite encapsulating material 100 includes a high insulation material 101 and a polymer material 102, and the high insulation material 101 may be located in the edge area of the composite encapsulating material 100. For example, the improved polyimide is arranged in the edge area of the composite encapsulating material 100. In the composite encapsulating material 100, the improved polyimide may be arranged outside at least three ends of the polymer material 102.

Here, it should also be noted that the specific structure form of the composite encapsulating material 100 is not limited to those listed above. For example, in other embodiments, the mixed material formed by the high insulation material and the polymer material may all be located in the edge area of the composite encapsulating material, or other structural forms can be adopted, which will not be repeated here.

The above-mentioned composite encapsulating material can be formed or prepared in various types, which can be a production process of a well-known general composite adhesive film material, and the present disclosure does not specifically limit the preparation method of the composite encapsulating material. For example, a method of co-extrusion of the high insulation material and the existing polymer material can be adopted, or a method where the high insulation material and the polymer material are prepared separately and then the high insulation material and the polymer material are bonded together can be adopted.

Specifically, in some embodiments, the composite encapsulating material is a composite encapsulating adhesive film, and the composite encapsulating adhesive film is a co-extruded film of the high insulation material and the polymer material. Optionally, the high insulation material includes the improved polyimide.

It can be understood that the aforementioned co-extruded film may also be a co-extruded film, which is a composite encapsulating adhesive film formed by using a co-extrusion process. Specifically, the high-polymer co-extrusion process is a processing method where different melt material streams are respectively supplied by a plurality of extruders and converged in a compositing head so as to be co-extruded to obtain multi-layer composite products. Exemplarily, the composite encapsulating adhesive film can be a composite encapsulating adhesive film prepared by respectively extruding the high insulation material and the polymer material such as POE or EVA from two single-screw extruders into the same co-extrusion die under certain extrusion conditions.

It should be noted that the embodiment of the present disclosure does not limit the specific preparation conditions of the composite encapsulating adhesive film, and it can be adjusted by those skilled in the art according to actual situations and will not be described in detail here.

In other embodiments, the composite encapsulating material is a composite encapsulating adhesive film, and the composite encapsulating adhesive film is composed of the high insulation material and the polymer material bonded together. That is, the high insulation material and the polymer material can be prepared separately, and then the two are bonded or stacked, to obtain the composite encapsulating material. Optionally, the high insulation material includes the improved polyimide.

It should be noted that the embodiment of the present disclosure does not limit the specific bonding manner of the high insulation material and the polymer material, and it can be selected and set by those skilled in the art according to actual situations and will not be described in detail here.

The present disclosure also provides a photovoltaic module, and it includes a composite encapsulating material and at least one solar cell string encapsulated with the composite encapsulating material.

The above composite encapsulating material can be used in a photovoltaic module, to isolate the glass and metal components of the photovoltaic module, and to encapsulate the photovoltaic module. Those skilled in the art can understand that, the photovoltaic module and the aforementioned composite encapsulating material are based on the same inventive concept, and the features and advantages described above for the composite encapsulating material are also applicable to the application of the photovoltaic module, which will not be repeated here.

Figure 4:
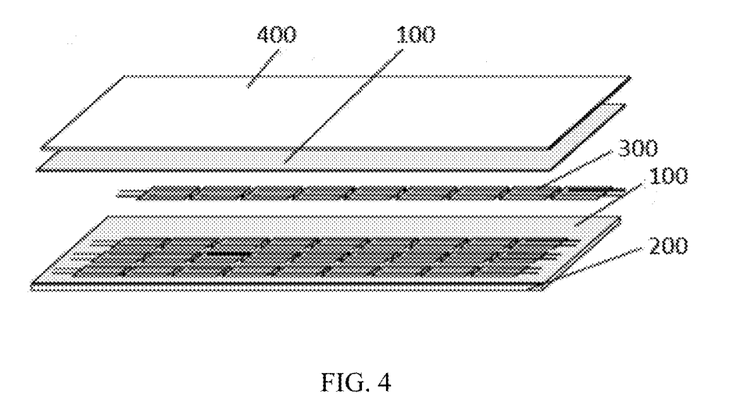
FIG. 4 is a structural schematic diagram of an exemplary photovoltaic module according to an embodiment of the present disclosure.

For illustration, as shown in FIG. 4, the photovoltaic module may include a back plate 400, a composite encapsulating material 100, a solar cell string 300, a composite encapsulating material 100, and glass 200 in an order from top to bottom. The composite encapsulating material 100 may be the composite encapsulating material as described above, and the composite encapsulating material 100 may be close to the glass 200 and/or the back plate 400. However, the present disclosure does not limit other components in the photovoltaic module, such as the solar cell string 300, the glass 200, and the back plate 400.

Figure 5:
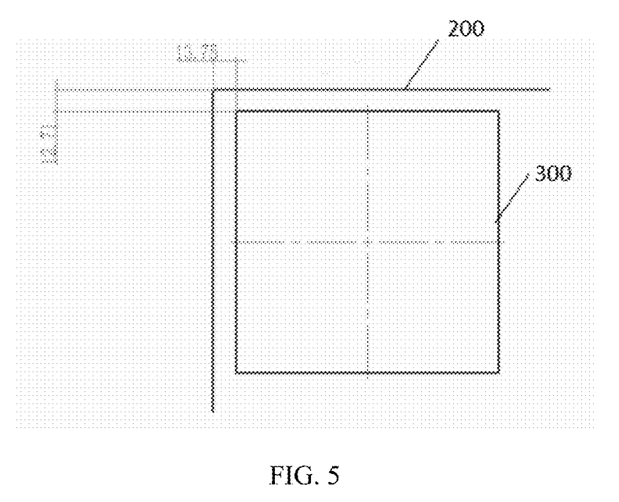
FIG. 5 is a schematic diagram of a partial structure of an exemplary photovoltaic module according to an embodiment of the present disclosure.

As shown in FIG. 5, due to the use of the composite encapsulating material 100, in the photovoltaic module, the distance between the solar cell string or the solar cell and an edge of the glass may be lower than 15 mm, which can meet the safety creepage. That is, under the same number of the solar cells, areas of the glass and the encapsulating material used in the module can be reduced, so that manufacture materials of the module can be saved, and overall costs can be reduced.

The preparation process and respective manufacturing steps of the photovoltaic module may be manufacturing steps of a well-known ordinary photovoltaic module, and the present disclosure does not impose special restrictions on the preparation of the photovoltaic module. Exemplarily, the preparation process of the photovoltaic module may be:

(1) Scribing each of a plurality of solar cells by laser: forming a plurality of slices of solar cells according to a predetermined parameter, such as a size of one slice of solar cell.

(2) Welding the slices of the plurality of solar cells: forming a super solar cell including a plurality of solar cell strings. Each of the plurality of solar cell strings may be formed by operably electrically connecting the slices of solar cells. For example, in accordance with an automatic welding technique, the solar cell string may be generated by welding the slices of the solar cells with welding materials.

(3) Laying: placing glass, composite encapsulating material, back plate and glass in order.

(4) Laminating: setting a suitable temperature and time, to crosslink an adhesive film material.

(5) Framing and curing: mounting a frame for the lamination structure and curing them. Thus an exemplary photovoltaic module may be produced.

(6) Power testing and classifying: testing the power output of the photovoltaic module and selecting a qualified photovoltaic module.

Based on the above description, in the photovoltaic module provided by the present disclosure, a new type of insulating material is introduced, that is, the described high insulation material, can reduce the geometric size of the glass of the module and save materials such as adhesives and back plates under the premise of meeting an IEC insulation performance, thereby improving the utilization rate of the materials of the module, reducing the weight of the module, and reducing the overall cost of the module.

In order to facilitate the understanding of the present disclosure, the present disclosure will be further described below in conjunction with specific embodiments.

Example 1

A composite encapsulating material, including improved polyimide and an EVA material, and the improved polyimide and the EVA material are co-extruded to obtain a composite encapsulating adhesive film. The improved polyimide includes following mass parts of raw materials: 70-80 parts of polyimide, 2-3 parts of polyperfluoroethylene propylene, 2 parts of fluorine-containing linear polyimide, and 2-4 parts of tetramethyldisiloxane. The edge bulk resistivity of the composite encapsulating material is $1.5$-$1.8 \times 10^{17}$ Ω·cm, and the breakdown voltage strength is 80-100 KV/mm.

The improved polyimide in the composite encapsulating material has a width of 20-30 mm and a thickness of 0.2 mm; it can be satisfied that a blank width between the composite encapsulating adhesive film module glass and the edge of the solar cell is shortened from 15 mm to 12 mm, thereby reducing consumption of the module glass and the adhesive film material, and reducing the weight of the module by about 0.4%.

Example 2

A composite encapsulating material, including improved polyimide and an EVA material, and the improved polyimide and EVA materials are co-extruded to obtain a composite encapsulating adhesive film. The improved polyimide includes following mass parts of raw materials: 80-92 parts of polyimide, 1-3 parts of polyperfluoroethylene propylene, 4-6 parts of fluorine-containing linear polyimide, and 3-5 parts of tetramethyldisiloxane. The edge bulk resistivity of the composite encapsulating material is $3.2$-$4.7\times10^{17}$ Ω·cm, and the breakdown voltage strength is 120-180 KV/mm.

Embodiment 3

Taking, by mass part, 80 parts of polypyromellitimide, 3 parts of polyperfluoroethylene propylene, 2 parts of fluorine-containing linear polyimide (fluorine-containing group: fluodiamine & perfluorocyclobutyl aryl ether group), and 4 parts of tetramethyldisiloxane, and mixing with EVA materials, then subjected to extrusion to obtain the composite encapsulating adhesive film.

Through testing, the bulk resistivity at edge of the composite encapsulating adhesive film is $1.6\times10^{17}$ Ω·cm, and the breakdown voltage is 100 KV/mm.

Embodiment 4

Taking, by mass part, 92 parts of polypyromellitimide, 1 part of polyperfluoroethylene propylene, 4 parts of fluorine-containing linear polyimide (fluorine-containing group: fluodiamine & perfluorocyclobutyl aryl ether group), and 3 parts of tetramethyldisiloxane, and mixing with EVA materials, then subjected to extrusion to obtain the composite encapsulating adhesive film.

Through testing, the bulk resistivity at edge of the composite encapsulating adhesive film is $4.5\times10^{17}$ Ω·cm, and the breakdown voltage is 150 KV/mm.

The width of the improved polyimide in the composite encapsulating material is larger than the width of the EVA material inside, and the thickness is 0.1 mm; it can be satisfied that a blank width between the composite encapsulating adhesive film module glass and the edge of the solar cell is shortened from 15 mm to 10 mm, thereby reducing consumption of the module glass and the adhesive film material, and reducing the weight of the module by about 0.5%.

The above descriptions are only some exemplary embodiments of the present disclosure and are not intended to limit the present disclosure. For those skilled in the art, the present disclosure can have various modifications and changes. Any modification, equivalent replacement, improvement, etc. made within the spirit and principle of the present disclosure shall be included in the protection scope of the present disclosure.

It should be pointed out that a part of the patent application file of the present disclosure contains content protected by copyright. Except for making copies of the patent documents or the contents of the recorded patent documents of the Patent Office, the copyright owner reserves the copyright.

What is claimed is:

1. A composite encapsulating material, comprising a polymer material and a high insulation material in at least a partial area of the composite encapsulating material,
   wherein the polymer material comprises ethylene-vinyl acetate copolymer (EVA),
   wherein the high insulation material comprises polyimide, modifier, ethylene vinyl and modified polyimide,
   wherein the modified polyimide comprises fluorine-containing linear polyimide, the fluorine-containing linear polyimide contains a fluodiamine & perfluorocyclobutyl aryl ether group and the modifier comprises polyperfluoroethylene propylene and tetramethyldisiloxane, and
   wherein the high insulation material comprises:
   70-95 parts of polyimide,
   1-10 parts of polyperfluoroethylene propylene,
   2-10 parts of fluorine-containing linear polyimide, and
   2-10 parts of tetramethyldisiloxane.

2. The composite encapsulating material according to claim 1, wherein the high insulation material further comprises an auxiliary agent, and the auxiliary agent at least comprises an anti-aging agent.

3. The composite encapsulating material according to claim 2, wherein the anti-aging agent comprises one or more of polybutylene terephthalate, polyethylene terephthalate, or acrylonitrile-butadiene styrene copolymer.

4. The composite encapsulating material according to claim 1, wherein the high insulation material comprises:
   70-80 parts of polyimide,
   2-5 parts of polyperfluoroethylene propylene,
   2-6 parts of fluorine-containing linear polyimide, and
   2-5 parts of tetramethyldisiloxane.

5. The composite encapsulating material according to claim 1, wherein the polymer material comprises one or more of polyolefin, ethylene or modified ethylene-vinyl acetate copolymer.

6. The composite encapsulating material according to claim 5, wherein the composite encapsulating material is a composite encapsulating adhesive film, and the composite encapsulating adhesive film is a co-extruded film of the high insulation material and the polymer material.

7. The composite encapsulating material according to claim 5, wherein the composite encapsulating material is a composite encapsulating adhesive film formed by bonding the high insulation material and the polymer material.

8. The composite encapsulating material according to claim 1, wherein the at least partial area comprises an edge area of the composite encapsulating material.

9. A photovoltaic module, comprising:
   a composite encapsulating material, and
   at least one group of solar cell strings encapsulated by the composite encapsulating material,
   wherein the composite encapsulating material comprises:
   a polymer material and a high insulation material in at least a partial area of the composite encapsulating material,
   wherein the polymer material comprises ethylene-vinyl acetate copolymer (EVA),
   wherein the high insulation material comprises polyimide, modifier, ethylene vinyl and modified polyimide,
   wherein the modified polyimide comprises fluorine-containing linear polyimide, the fluorine-containing linear polyimide contains a fluodiamine & perfluorocyclobutyl aryl ether group and the modifier comprises polyperfluoroethylene propylene and tetramethyldisiloxane, and wherein the high insulation material comprises:
70-95 parts of polyimide,
1-10 parts of polyperfluoroethylene propylene,
2-10 parts of fluorine-containing linear polyimide, and
2-10 parts of tetramethyldisiloxane.

10. The photovoltaic module according to claim 9, wherein the high insulation material further comprises an auxiliary agent, and the auxiliary agent at least comprises an anti-aging agent.

11. The photovoltaic module according to claim 10, wherein the anti-aging agent comprises one or more of polybutylene terephthalate, polyethylene terephthalate, or acrylonitrile-butadiene styrene copolymer.

12. The photovoltaic module according to claim 9, wherein the high insulation material comprises:
70-80 parts of polyimide,
2-5 parts of polyperfluoroethylene propylene,
2-6 parts of fluorine-containing linear polyimide, and
2-5 parts of tetramethyldisiloxane.

13. The photovoltaic module according to claim 9, wherein the polymer material comprises one or more of polyolefin or modified ethylene-vinyl acetate copolymer.

14. The photovoltaic module according to claim 13, wherein the composite encapsulating material is a composite encapsulating adhesive film, and the composite encapsulating adhesive film is a co-extruded film of the high insulation material and the polymer material.

15. The photovoltaic module according to claim 13, wherein the composite encapsulating material is a composite encapsulating adhesive film formed by bonding the high insulation material and the polymer material.

16. The photovoltaic module according to claim 9, wherein the at least partial area comprises an edge area of the composite encapsulating material.

17. The composite encapsulating material according to claim 4, wherein the high insulation material comprises:
80 parts of polyimide,
3 parts of polyperfluoroethylene propylene,
2 parts of fluorine-containing linear polyimide, and
4 parts of tetramethyldisiloxane.

18. The composite encapsulating material according to claim 1, wherein the high insulation material comprises:
92 parts of polyimide,
1 parts of polyperfluoroethylene propylene,
4 parts of fluorine-containing linear polyimide, and
3 parts of tetramethyldisiloxane.

19. Photovoltaic module according to claim 12, wherein the high insulation material comprises:
80 parts of polyimide,
3 parts of polyperfluoroethylene propylene,
2 parts of fluorine-containing linear polyimide, and
4 parts of tetramethyldisiloxane.

20. Photovoltaic module according to claim 9, wherein the high insulation material comprises:
92 parts of polyimide,
1 parts of polyperfluoroethylene propylene,
4 parts of fluorine-containing linear polyimide, and
3 parts of tetramethyldisiloxane.

* * * * *